United States Patent
Shih et al.

(10) Patent No.: US 8,370,730 B2
(45) Date of Patent: *Feb. 5, 2013

(54) SOFT OUTPUT VITERBI DETECTOR WITH ERROR EVENT OUTPUT

(75) Inventors: Shih-Ming Shih, San Joses, CA (US); Kwok Alfred Yeung, Milpitas, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 877 days.

This patent is subject to a terminal disclaimer.

(21) Appl. No.: 12/455,803

(22) Filed: Jun. 4, 2009

(65) Prior Publication Data

US 2010/0070834 A1    Mar. 18, 2010

Related U.S. Application Data

(63) Continuation of application No. 11/274,924, filed on Nov. 14, 2005, now Pat. No. 7,590,927.

(51) Int. Cl.
*H04B 15/00* (2006.01)
(52) U.S. Cl. .......... 714/795; 714/786
(58) Field of Classification Search .......... 714/795, 714/786
See application file for complete search history.

(56) References Cited

U.S. PATENT DOCUMENTS

| | | | |
|---|---|---|---|
| 5,521,945 A | 5/1996 | Knudson | |
| 5,684,811 A | 11/1997 | Doran | |
| 6,061,823 A | 5/2000 | Nara | |
| 6,185,173 B1 * | 2/2001 | Livingston et al. | 369/59.21 |
| 6,427,220 B1 | 7/2002 | Vityaev | |
| 6,513,141 B1 | 1/2003 | Livingston | |
| 6,694,477 B1 * | 2/2004 | Lee | 714/784 |
| 6,732,328 B1 * | 5/2004 | McEwen et al. | 714/795 |
| 6,981,201 B2 * | 12/2005 | Reggiani et al. | 714/786 |
| 7,099,411 B1 * | 8/2006 | Wu et al. | 375/341 |
| 7,206,363 B2 * | 4/2007 | Hegde et al. | 375/341 |
| 7,222,288 B2 | 5/2007 | Varma et al. | |
| 7,328,395 B1 | 2/2008 | Burd | |
| 7,444,582 B1 | 10/2008 | Au et al. | |
| 7,571,372 B1 | 8/2009 | Burd et al. | |
| 2004/0181732 A1 | 9/2004 | McEwen et al. | |
| 2008/0276156 A1 | 11/2008 | Gunnam et al. | |
| 2008/0301521 A1 | 12/2008 | Gunnam et al. | |

OTHER PUBLICATIONS

Reexam Request for U.S. Appl. No. 95/001,731 submitted Aug. 30, 2011.*
Office Action mailed Oct. 22, 2011 for U.S. Appl. No. 95/001,731.
Order Granting/Denying Request for Inter Partes Reexamination mailed Oct. 24, 2011 for U.S. Appl. No. 95/001,731.

* cited by examiner

*Primary Examiner* — Joseph Schell
(74) *Attorney, Agent, or Firm* — Van Pelt, Yi & James LLP (57) ABSTRACT

Outputting information for recovering a sequence of data is disclosed. Outputting includes making a decision that selects a first sequence of states corresponding to a surviving path, determining a second sequence of states corresponding to a non-surviving path associated with the decision, and defining a possible error event based at least in part on the second sequence of states.

24 Claims, 7 Drawing Sheets

$$S^{i+1} = \min(S_0^i + b_0, S_1^i + b_1)$$

$$\Delta = (S_0^i + b_0) - (S_1^i + b_1)$$

E = Error Event

SOFT OUTPUT VITERBI DETECTOR WITH ERROR EVENT OUTPUT

CROSS REFERENCE TO OTHER APPLICATIONS

This application is a continuation of U.S. patent application Ser. No. 11/274,924, entitled SOFT OUTPUT VITERBI DETECTOR WITH ERROR EVENT OUTPUT filed Nov. 14, 2005 now U.S. Pat. No. 7,590,927 which is incorporated herein by reference for all purposes.

BACKGROUND OF THE INVENTION

Viterbi decoders are commonly used in digital communications systems, such as in wireless and data storage systems. Some Viterbi decoders make hard decisions. At the output, a decision is provided without other useful information. There is no indication of how reliable the decision is, nor is there information that can be used to attempt to correct any errors. Some Viterbi detectors do provide soft information; however it would be useful to improve the exactness and reliability of such information especially relating to possible errors. An improved method of processing soft information in a Viterbi decoder would be useful.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
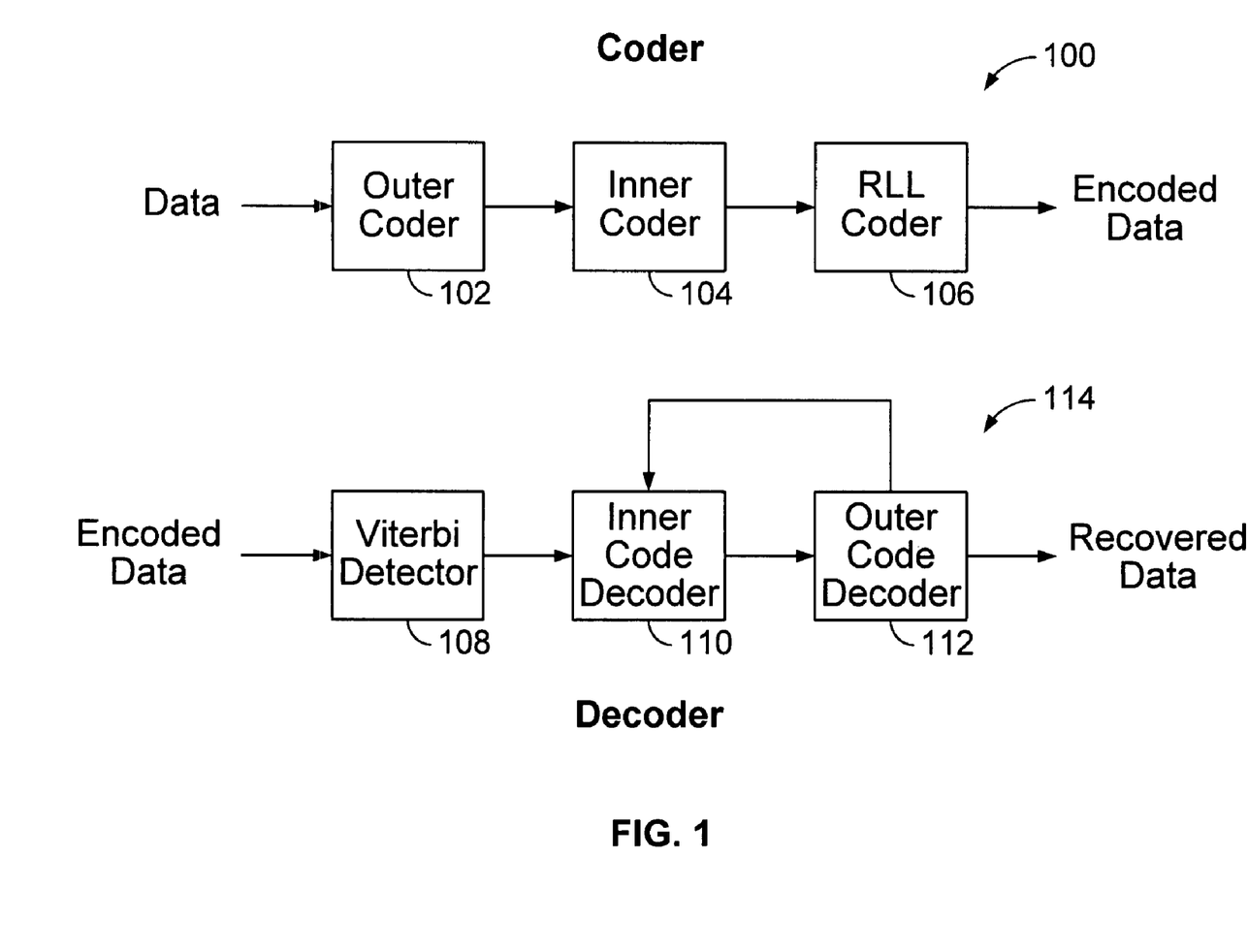
FIG. 1 is a block diagram illustrating an embodiment of a system for encoding and decoding data.

FIG. 1 is a block diagram illustrating an embodiment of a system for encoding and decoding data. In this example, coding system 100 is shown to include outer coder 102, inner coder 104, and run length limited (RLL) coder 106. A sequence of data (e.g., bits) is provided to outer coder 102. Outer coder 102 could use, for example, a Reed Solomon code. The output of outer coder 102 is provided to inner coder 104. Inner coder 104 could use, for example, a low density parity check code (LDPC), parity code, or Turbo code. The output of inner coder 104 is provided to RLL coder 106. The output of RLL coder 106 is the encoded data. The encoded data can then be stored in a data storage medium.

In some embodiments, the data is recovered using decoding system 114. In this example, decoding system 114 is shown to include Viterbi detector 108, inner code decoder 110, and outer code decoder 112. Encoded data is provided to Viterbi detector 108. Viterbi detector 108 attempts to recover data using the Viterbi algorithm. Viterbi detector 108 can correct errors introduced by the noise of a partial response channel, for example. The output of Viterbi detector 108 is provided to inner code decoder 110, where inner code decoder corresponds to inner coder 104. The output of Viterbi detector 108 may include a decision, reliability information, and/or possible error event information, as more fully described below. The output of inner code decoder 110 is provided to outer code decoder 112, where outer code decoder corresponds to outer coder 102. An output of outer code decoder 112 is the recovered data.

In some embodiments, an output of outer code decoder 112 is fed back to inner code decoder 110. For example, an indication of whether there is an error can be provided to inner code decoder 110. Inner code decoder 110 can then attempt to correct the error.

In this example, a Viterbi detector is shown to correct errors introduced by the noise of a channel, such as a partial response channel in a data storage system. In various embodiments, a Viterbi decoder can be used to recover data that has been coded using a convolutional code. As such, the terms "Viterbi detector" and "Viterbi decoder" can be used interchangeably in the examples described herein.

Figure 2:
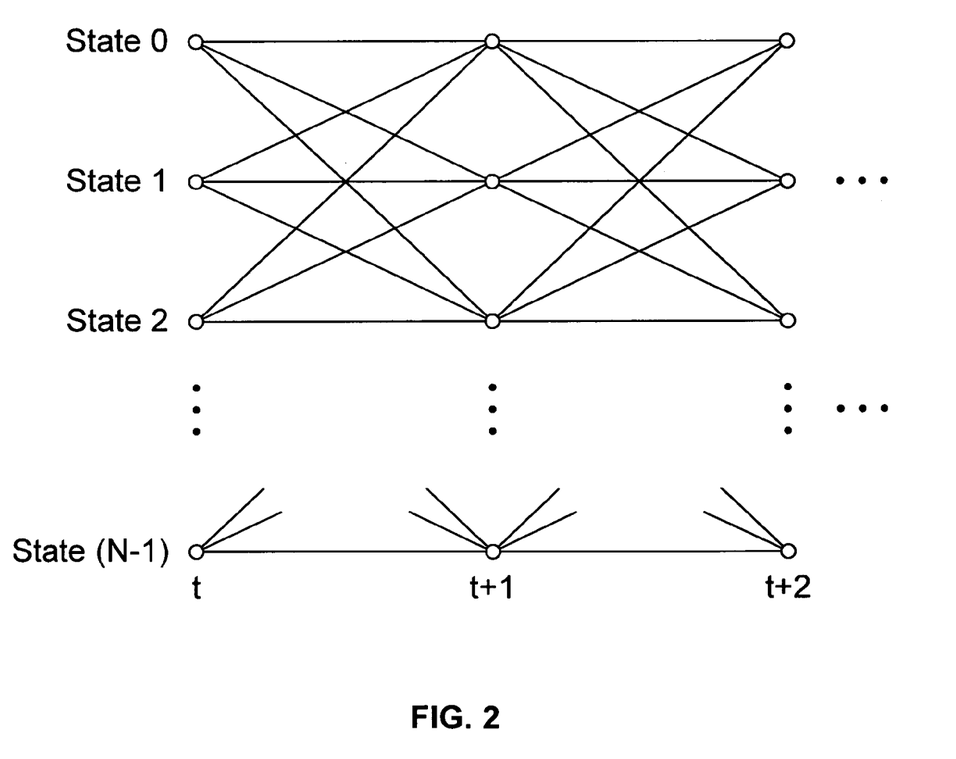
FIG. 2 is a diagram illustrating an embodiment of a trellis diagram related to the Viterbi algorithm.

FIG. 2 is a diagram illustrating an embodiment of a trellis diagram related to the Viterbi algorithm. In this example, N states are shown. At time t, the output can be at any one of states 0 to N−1. At time t+1, the output can enter the same or another state, depending on the allowable transitions from the previous state. At time t+2, the output can enter another state. For each state and for each time, a path metric can be calculated. The path metrics can be used to select the sequence of states corresponding to the most likely input sequence, as more fully described below. In this example, three points in time are shown. The trellis diagram can be extended to include any length of time.

The Viterbi algorithm is implemented in various ways in various embodiments. Any appropriate trellis diagram can be constructed for recovering data encoded by various codes and/or channels.

Figure 3A:
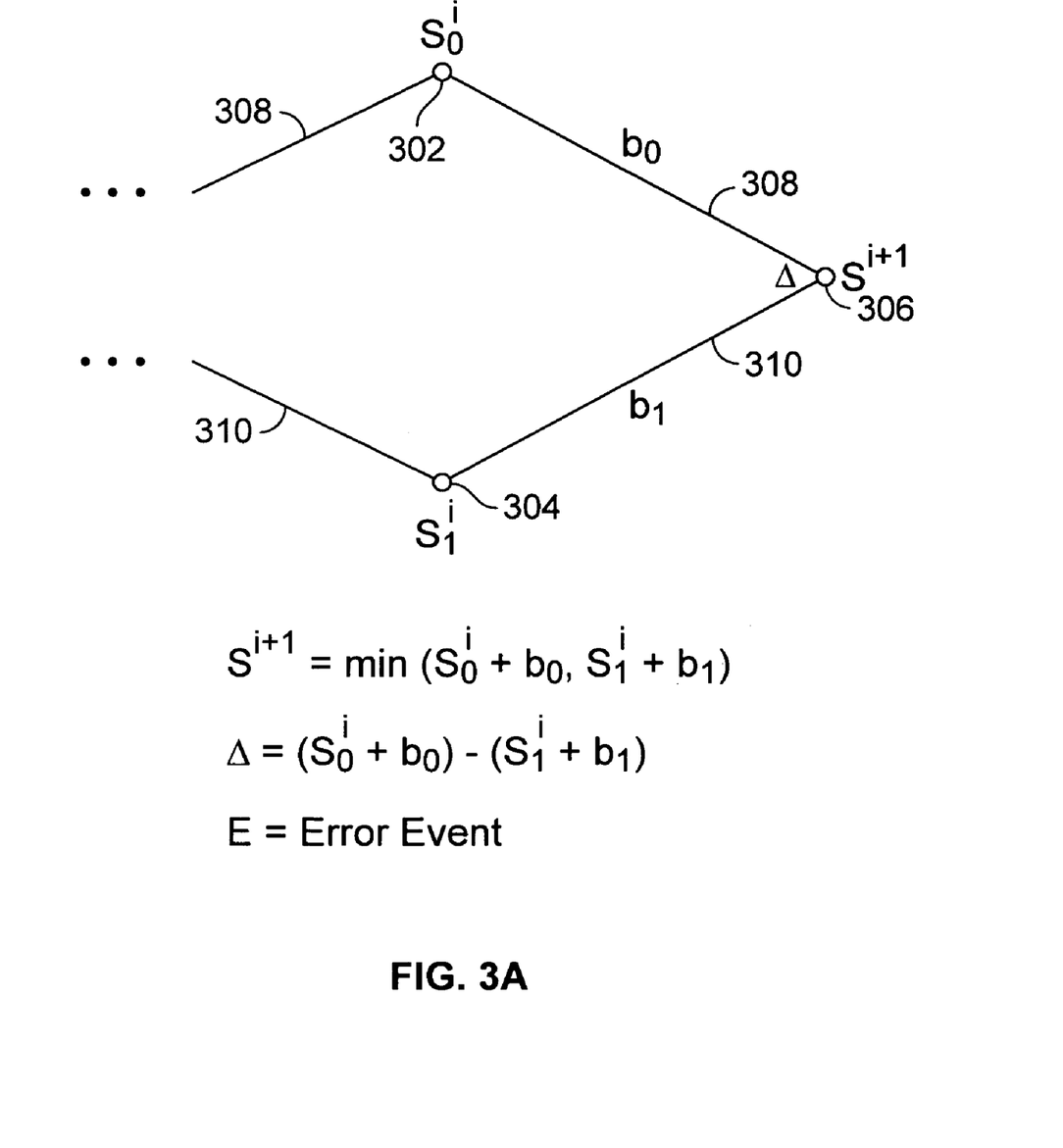
FIG. 3A is a diagram illustrating an embodiment of a portion of a trellis diagram.

FIG. 3A is a diagram illustrating an embodiment of a portion of a trellis diagram. A portion of a trellis diagram is shown, including states 302 and 304 at time i, and state 306 at time i+1. Path 308 passes through the most likely sequence of states that enters state 302 at time i. Path 310 passes through the most likely sequence of states that enters state 304 at time i. At state 306, one of paths 308 or 310 is selected as the most likely sequence of states that enters state 306 at time i+1. In some embodiments, an "add, compare, select" process is performed.

$S_0^i$, $S_1^i$, and $S^{i+1}$ are the path metrics corresponding to states 302, 304, and 306, respectively. $b_0$ is the branch metric corresponding to the branch from state 302 to state 306. $b_1$ is the branch metric corresponding to the branch from state 304 to state 306. In some embodiments, the branch metrics are the Euclidian distance or Hamming distance between the received symbol and the input symbol corresponding to the branch. In this example, $S^{i+1}=\text{Min}(S_0^i+b_0, S_1^i+b_1)$. $S_0^i+b_0$ is the path metric corresponding to path 308. $S_1^i+b_1$ is the path metric corresponding to path 310. Thus, "add" refers to computing $S_0^i+b_0$ and/or $S_1^i+b_1$. "Compare" refers to determining the minimum. "Select" refers to selecting the path corresponding to the minimum path metric. If there is more than one path entering a given state at time i+1, the path corresponding to the minimum path metric is selected. The selected path can be referred to as a surviving path. A path that is not selected can be referred to as a non-surviving path.

The difference between the path metrics is: $\Delta=(S_0^i+b_0)-(S_1^i+b_1)$. In some embodiments, $\Delta$ is saved for each state. In various embodiments, $|\Delta|$ or another appropriate value is stored. $\Delta$ is a measure of the reliability of the decision to select path 308 over path 310. The lower $\Delta$, the closer the two path metrics, and the lower the reliability of the decision. Reliability information can be used in various ways in various embodiments to improve the performance of the system, as more fully described below.

Errors in the output of a Viterbi detector may be correlated. In some embodiments, a possible error event is saved for each state. An error event, as used herein, is a sequence of one or more bit or symbol errors. The error event is stored by storing information associated with a non-surviving path. In some embodiments, the error event is represented by an indicator. The indicator indicates the pattern of the potential error event. For example, the indicator could be the difference between the first sequence of states and the second sequence of states. For example, suppose an input of 0 causes a transition from state 302 to state 306 and that an input of 1 causes a transition from state 304 to state 306. Suppose that path 308 is selected as the surviving path. Path 310 is a non-surviving path. If path 308 is not the correct path, then the other possibility is path 310. An indicator could thus be stored as the difference between 0 and 1. As used herein, "+" indicates a positive difference "−" indicates a negative difference, and "0" indicate no difference. Thus, the possible error event could be represented by "−".

Various examples of error events include "+" for a single bit error event, "+−" for a two bit error event, "+−+" for a tribit error event, and "+0+" for another type of error event, etc. In some embodiments, possible error event indicators are stored in a lookup table, such as the following:

| Index | Error Event |
|-------|-------------|
| 0 | None of the Below |
| 1 | + |
| 2 | +− |
| 3 | +−+ |
| 4 | +−+− |
| 5 | +0+ |
| 6 | +00+ |
| 7 | +−+−+ |

In some embodiments, the indicator includes the index of the lookup table.

In some embodiments, for each state at each time in the trellis diagram, a decision, reliability information, and error event information is stored. The error event information includes information associated with a non-surviving path.

Figure 3B:
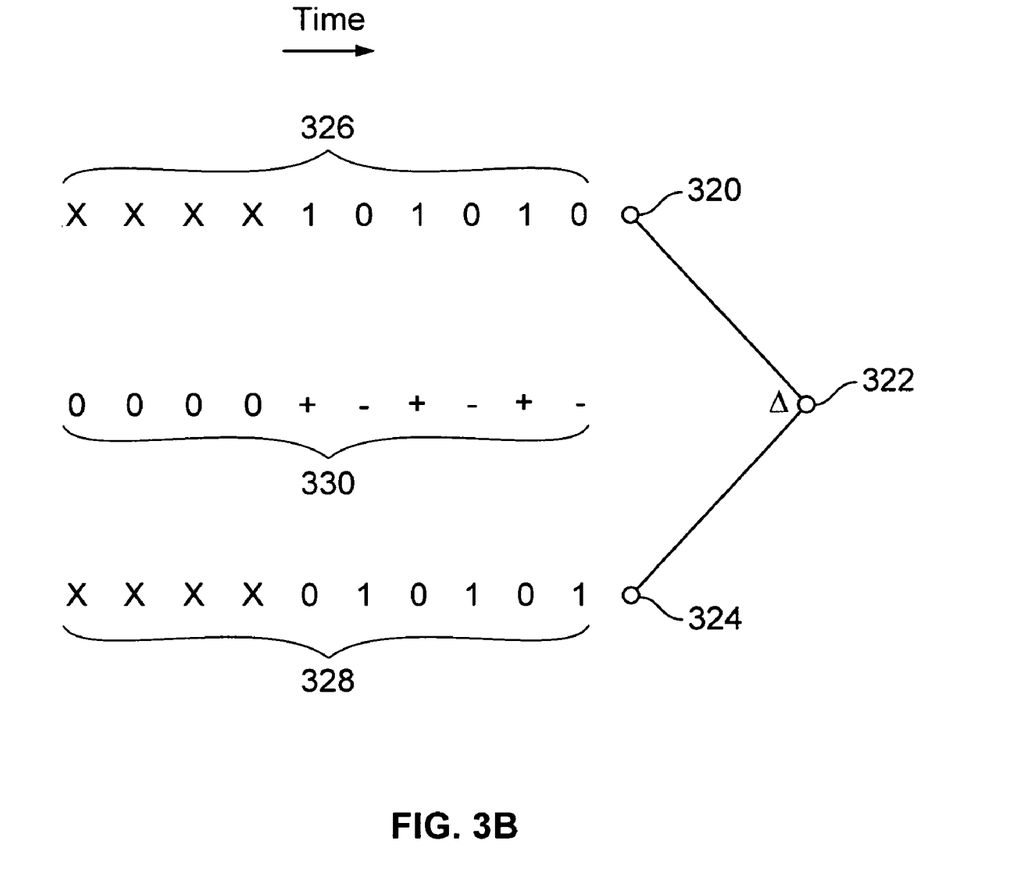
FIG. 3B is a diagram illustrating an embodiment of an error event

FIG. 3B is a diagram illustrating an embodiment of an error event. In this example, input 326 associated with the path entering state 320 is shown. Input 328 associated with the path entering state 324 is shown. "X" indicates any value. Assume that the path through state 320 is selected as the surviving path for state 322. Then the path through state 324 is the non-surviving path. In some embodiments, an indicator 330 is determined by calculating the difference between the inputs associated with the two paths. In this example, the difference between the two paths is "−+−+−+0000," which can be obtained by taking the difference between input 326 and input 328. "−+−+−+0000" is the difference with the most recent bit listed first. The difference may be listed in the reverse order or in other ways.

Figure 4:
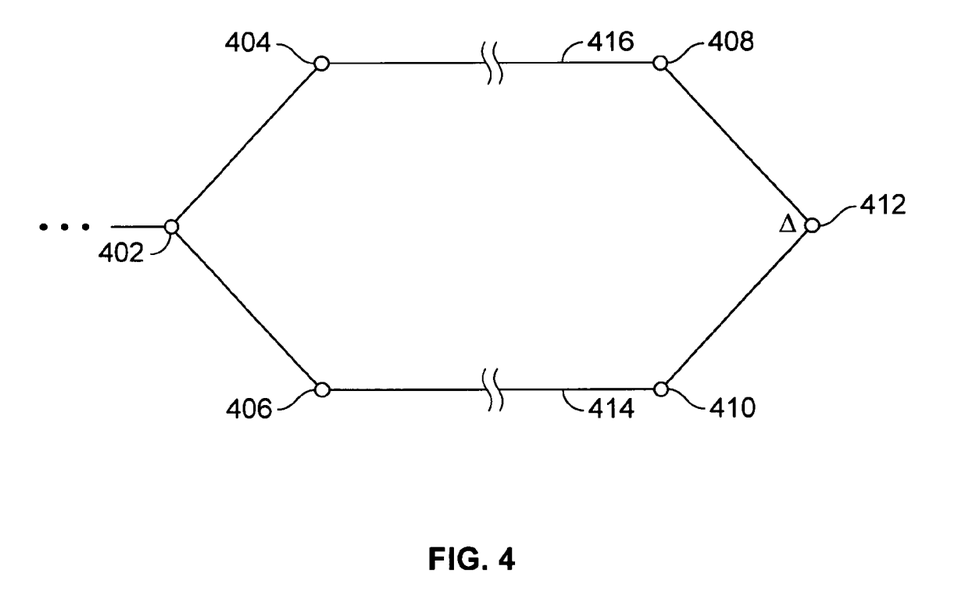
FIG. 4 is a diagram illustrating an embodiment of a portion of a trellis diagram.

FIG. 4 is a diagram illustrating an embodiment of a portion of a trellis diagram. In this example, path 416 is shown to traverse states 402, 404, ..., 408, and 412. Path 414 is shown to traverse states 402, 406, ..., 410, and 412. In other words, path 416 and path 414 originate at a common state, state 402. If previous decisions are traced back far enough, two paths may converge on one state. $\Delta$ is an exact value of the difference between the path metrics. $\Delta$ can thus be considered an exact measure of the reliability of the decision to select one path over another path.

Figure 5:
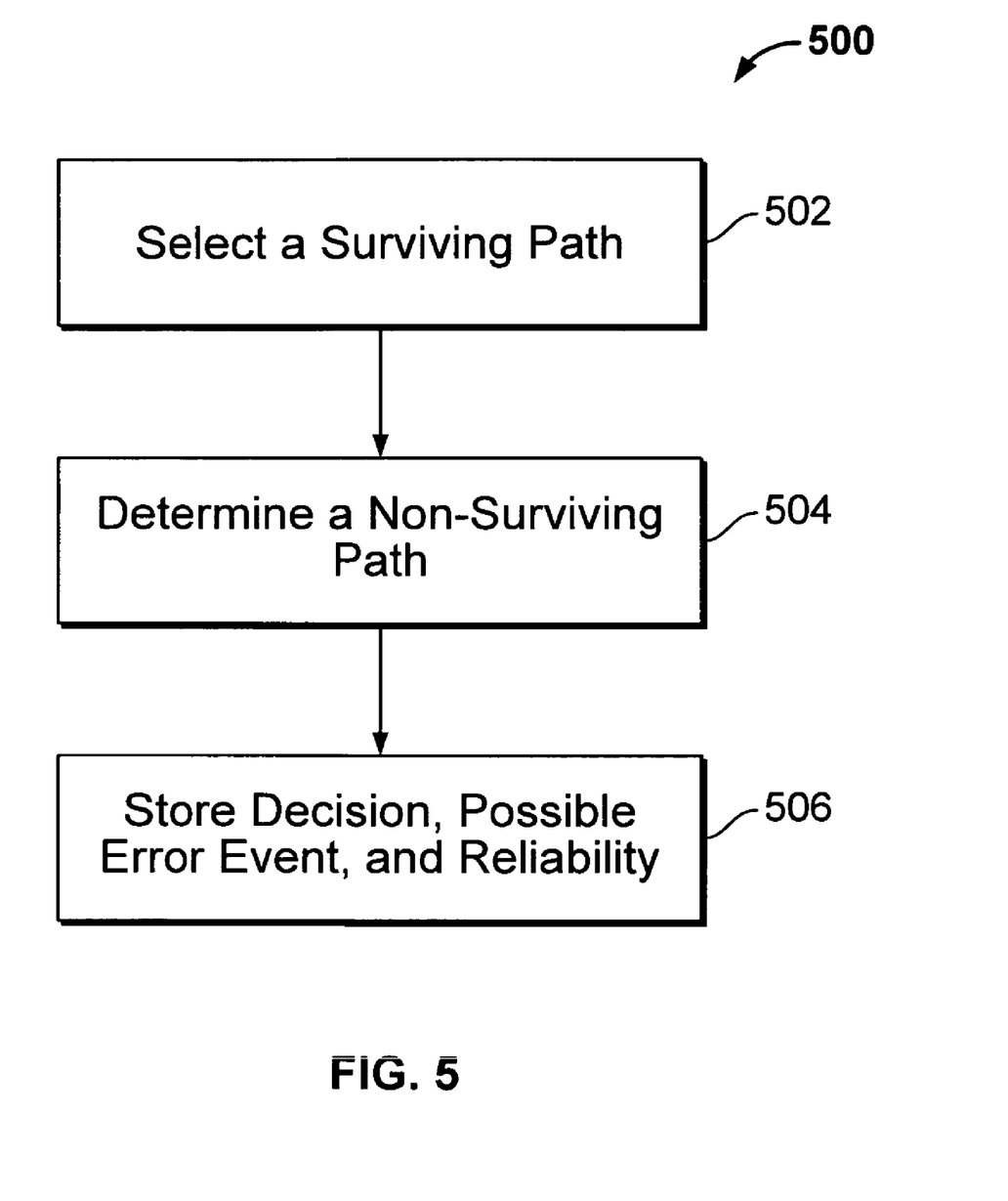
FIG. 5 is a flowchart illustrating an embodiment of a process for selecting a path.

FIG. 5 is a flowchart illustrating an embodiment of a process for selecting a path. For example, process 500 can be performed when selecting one of paths 308 or 310 in during an "add, compare, select" process in the Viterbi algorithm. In this example, at 502, a surviving path is determined. Path 308 is selected. At 504, a non-surviving path 310 is selected. In some embodiments, more than one non-surviving path can exist. In this case, the path with the path metric that is closest to that of the selected (surviving path) can be selected as the non-surviving path. In some embodiments, more than one non-surviving path can be selected.

At 506, a decision, possible error event, and reliability are stored. For example, the decision to select path 308 is stored. The possible error event may include an indicator stored in a lookup table, as described above. The reliability includes $\Delta$, as described above or some other appropriate measure of reliability.

Figure 6:
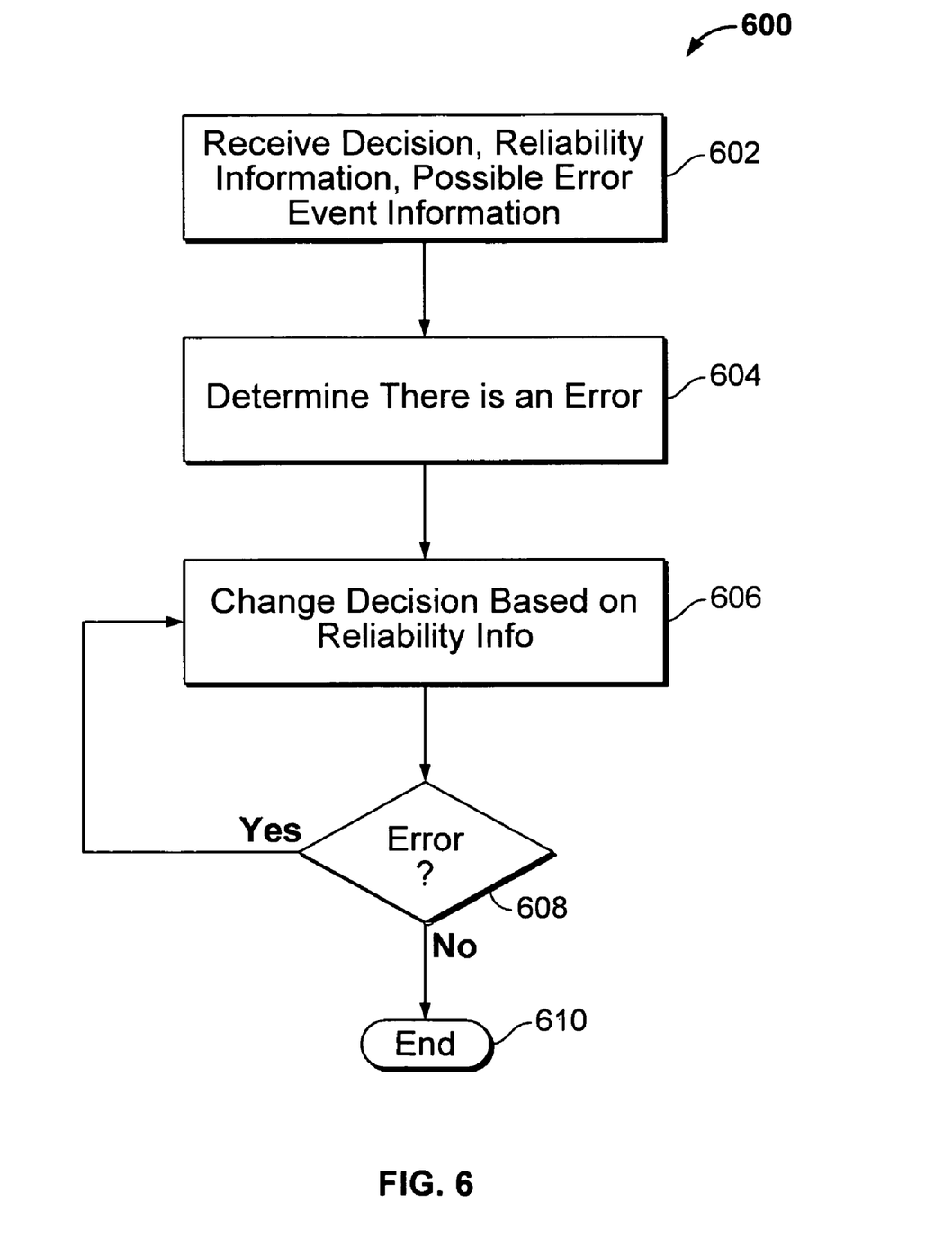
FIG. 6 is a flowchart illustrating an embodiment of a process for correcting an error.

FIG. 6 is a flowchart illustrating an embodiment of a process for correcting an error. For example, process 600 can be performed by decoder 114 in FIG. 1. At 602, a decision, reliability information, and possible error event information are received. For example, in decoder 114, a decision, reliability information, and possible error event information is received from Viterbi detector 108. In some embodiments, an output decision is made by selecting the state with the minimum path metric at the output. The path corresponding to that minimum path metric is the selected output path.

For each state along the output decision path, a local decision corresponding the minimum path metric ending at that state, associated reliability information (e.g., Δ), and possible error event information (e.g., an indicator) are stored. In some embodiments, this information is stored according to process 500, as described above.

At 604, it is determined that there is an error. One technique for determining an error is to calculate a syndrome. For example, in decoder 114, syndromes could be calculated by outer code decoder 112. If the syndromes are not all zero, then it is determined that there is an error.

At 606, the output decision is changed based at least in part on the reliability information. For example, a non-surviving path could be selected to replace a surviving path along the selected output path. By examining the various decisions made at each state along the selected output path, it can be determined where Δ is relatively small. When Δ is relatively small, the reliability is relatively low. For example, at the location along the path where Δ is smallest, the decision could be changed. At that location, the surviving path could be replaced with a non-surviving path. The non-surviving path can be derived from the indicator, since the indicator indicates the possible error event at that location.

At 608, it is determined whether there is an error. One technique for determining an error is to calculate a syndrome. For example, in decoder 114, syndromes could be calculated by outer code decoder 112. If the syndromes are not all zero, then it is determined that there is an error. In some embodiments, it is acceptable for the syndromes to not all be zero, as long as a sufficient (e.g., a predetermined) number of errors can be corrected by outer code decoder 112. In this case, at 608, it is determined whether a sufficient number of errors are correctable. In some embodiments, other rules can be set, in which case, at 608, it is determined whether the current output is acceptable according to such rules.

If it is determined at 608 that there is an error, the process returns to 606, and the output decision is changed based at least in part on the reliability information. For example, the previous change is reversed, and another change is made. Another non-surviving path is selected. In some embodiments, the new change is determined by selecting the next least reliable error event along the selected output path. A non-surviving path associated with the next smallest reliability (e.g., Δ) is selected.

If it is determined at 608 that there is no error, the process ends at 610. As such, the reliability information and/or possible error event information can be used to improve the performance of the system.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, including:
    making a decision, using a processor, that selects a first sequence of states corresponding to a surviving path;
    determining a second sequence of states, using the processor, corresponding to a non-surviving path associated with the decision;
    defining a possible error event, using the processor, based at least in part on the second sequence of states; and
    replacing the first sequence of states with the second sequence of states using the processor.

2. The method recited in claim 1, wherein defining includes determining the difference between a set of inputs corresponding to the first sequence of states and a set of inputs corresponding to the second sequence of states.

3. The method as recited in claim 1, wherein there is a plurality of surviving paths.

4. The method as recited in claim 1, wherein each state has at least one surviving path.

5. The method recited in claim 1, further including determining a reliability, wherein the reliability includes the difference between a path metric associated with the first sequence of states and a path metric associated with the second sequence of states.

6. The method recited in claim 1, further including storing an indicator, wherein the indicator includes the difference between a set of inputs associated with the first sequence of states and a set of inputs associated with the second sequence of states.

7. The method recited in claim 1, further including storing an indicator based on a lookup table.

8. The method recited in claim 1, further including replacing the first sequence of states with a third sequence of states.

9. The method recited in claim 1, further including:
    receiving a determination that an error has not been corrected; and
    replacing the first sequence of states with a third sequence of states based at least in part on an indicator.

10. The method recited in claim 1, wherein the error event includes a sequence of one or more bit or symbol errors.

11. The method recited in claim 1, wherein the first sequence of states and the second sequence of states originate from a common state.

12. The method recited in claim 1, wherein one or more of the following is stored: the decision, the possible error event, or reliability information.

13. The method recited in claim 1, further including determining a reliability associated with the decision or the error event.

14. The method recited in claim 1, further including storing information associated with the second sequence of states.

15. The method recited in claim 1, further including storing an indicator.

16. The method recited in claim 1, wherein the non-surviving path is derived from an indicator.

17. The method recited in claim 1, further including determining that an error exists and attempting to correct the error by reversing an error event.

18. The method recited in claim 1, further including:
    receiving a determination that there is an error; and
    correcting the error by replacing the first sequence of states with the second sequence of states based at least in part on an indicator.

19. The method recited in claim 1, wherein there is a plurality of non-surviving paths.

20. The method recited in claim 1, wherein each state has at least one non-surviving path.

21. The method recited in claim 1, wherein the method is performed by a Viterbi decoder.

22. The method recited in claim 1, wherein the method is performed by a data storage system.

23. The method recited in claim 1, wherein the method is performed on data obtained from storage.

24. A computer program product, the computer program product being embodied in a non-transitory computer readable storage medium and comprising computer instructions for:
    making a decision that selects a first sequence of states corresponding to a surviving path;

determining a second sequence of states corresponding to a non-surviving path associated with the decision;

defining a possible error event based at least in part on the second sequence of states; and replacing the first sequence of states with the second sequence of states.

* * * * *

UNITED STATES PATENT AND TRADEMARK OFFICE
CERTIFICATE OF CORRECTION

PATENT NO. : 8,370,730 B2  
APPLICATION NO. : 12/455803  
DATED : February 5, 2013  
INVENTOR(S) : Shih et al.

Page 1 of 1

It is certified that error appears in the above-identified patent and that said Letters Patent is hereby corrected as shown below:

On the Title Page

Item (75) Inventors, "San Joses" should be -- San Jose --

Item (75) Inventors, "Kwok Alfred Yeung" should be -- Kwok W. Yeung --

Signed and Sealed this
Seventeenth Day of February, 2015

Michelle K. Lee
*Deputy Director of the United States Patent and Trademark Office*